United States Patent [19]

Ravaglia

[11] Patent Number: 4,868,136

[45] Date of Patent: Sep. 19, 1989

[54] PROCESS OF FORMING AN ISOLATION STRUCTURE

[75] Inventor: Andrea Ravaglia, Monza, Italy

[73] Assignee: SGS-Thomson Microelectronics s.r.l., Italy

[21] Appl. No.: 178,822

[22] Filed: Mar. 24, 1988

Related U.S. Application Data

[62] Division of Ser. No. 863,895, May 16, 1986, abandoned.

[30] Foreign Application Priority Data

Aug. 28, 1985 [IT] Italy .................. 21994 A/85

[51] Int. Cl.[4] .................. H01L 21/265; H01L 21/302
[52] U.S. Cl. .................. 437/38; 437/67; 437/73; 357/55
[58] Field of Search .................. 437/67, 78, 79, 38, 437/69, 70, 73; 357/49, 50, 55

[56] References Cited

U.S. PATENT DOCUMENTS

| | | |
|---|---|---|
| 3,997,378 | 12/1976 | Kaji et al. .................. 437/63 |
| 4,334,348 | 6/1982 | Trenary et al. .................. 156/653 |
| 4,390,393 | 6/1983 | Ghezzo et al. .................. 357/23.11 |
| 4,593,459 | 6/1986 | Poppert et al. .................. 357/50 |
| 4,611,386 | 9/1986 | Goto .................. 357/50 |

FOREIGN PATENT DOCUMENTS

| | | | |
|---|---|---|---|
| 0104765 | 4/1984 | European Pat. Off. .................. | 437/67 |
| 55-154748 | 12/1980 | Japan .................. | 437/67 |
| 60-171761 | 9/1985 | Japan .................. | 437/67 |

OTHER PUBLICATIONS

Wu, et al. "The Influence of the Locos Processing Parameters on the Shape of the Bird's Beak Structure", J. Electrochem. Soc.: Solid-State Science and Technology, Jul. 1983.
Morandi, International Electron Devices Meeting, Session 18: Integrated Electronics IV-Process Technology, Oct. 31, 1969, p. 126.

Primary Examiner—Olik Chauchuri
Attorney, Agent, or Firm—Pollock, Vande Sande & Priddy

[57] ABSTRACT

Two thin wedges of oxide extending along and from the boundaries of the field oxide layer without solution of continuity inside the substrate for a depth such as to separate dielectrically the region of silicon, present underneath the field oxide layer, having a doping level higher than the doping level of the bulk of the substrate and the regions of oppositely doped silicon in a MOS device allow obtaining simultaneously a high threshold voltage of the parasitic transistor, a high junction breakdown voltage and an excellent immunity to "Reach-through" between the depletion regions of uncorrelated junctions together with a reduced capacitance of the junctions and an improved geometry. Such wedges of oxide are obtained by means of deep anisotropic etch of silicon through a suitably exposed area, for example by means of an overetch of the nitride used for growing the thick oxide layer according to the known technique and by the subsequent filling of the deep etch with thermally grown silicon oxide.

2 Claims, 3 Drawing Sheets

PROCESS OF FORMING AN ISOLATION STRUCTURE

This application is a division of S.N. 863,895, filed on May 16, 1986, now abandoned.

BACKGROUND OF THE INVENTION

1. Field of the Invention

The present invention concerns a new and improved isolation structure for MOS devices and the process of preparing the same.

More generally the invention concerns the fabrication of bipolar and unipolar semiconductor devices of the MOS type (Metal-Oxide-Semiconductor), be they linear integrated circuits or digital integrated circuits of low (SSI), medium (MSI), large (LSI) or very large (VLSI) scale of integration. For the sake of a greater descriptive simplicity, in the instant disclosure, though referring generically to MOS devices or processes of the N channel type (NMOS), it is intended, obviously, to include the various known MOS technologies, that is: P channel (PMOS), complementary (CMOS) and variations thereof.

2. Description of the Prior Art

Modern fabrication processes for semiconductor devices of the MOS type, often referred to as "MOS processes", utilize special fabrication techniques developed for improving the geometry of the tormented profile of the surface of the devices and for allowing ever greater degree of integration. A main objective of such techniques being the elimination (or the smoothing) of sharp edges in the layer of silicon oxide used for defining the areas wherein the active and passive components of the device are formed and which edges bring about points of great fragility of the overlying layer of metallization. Processes such as the Locos process of Philips and the Planox process of SGS are well known fabrication processes for semiconductors of the MOS type;

Such processes are amply described in literature, and a description thereof appears in the book by H. Lilen "Principles et applications CI/MOS" Editions Radio, Paris, 1972, from pag. 61 to pag. 65.

In particular, the Planox process is disclosed in the publications by F. Morandi-IEDM Techn. Dig. Session 18, Oct. 1969 and by T. C. Wu-W. T. Stacy and K. N. Ritz-Journal of Electrochemical Society, 130, 1563 (1983).

A crucial stage of the Planox process is the formation of the field oxide, that is of the dielectric structure which isolates the various active and passive elements forming the MOS device.

Such a structure is formed by growing a layer of oxide of suitable thickness, commonly about 5000–15000 Å, on areas of the substrate single crystal silicon defined by removing with photolithographic techniques the masking layer of silicon nitride from the desired areas. The remaining nitride layer effectively protects from oxidation the areas where will be later formed the active and passive elements of the integrated circuit.

The steps which are formed in growing the oxide of the isolation structure are lower because the growth of the thick oxide layer on the uncovered areas progresses for about half of its thickness below the original surface of silicon thus resulting in "buried" oxide for about half of its thickness.

Indeed, because of the way the field oxide is formed, its lateral edges are not vertical but decisively swaged. That is, being the process of oxidation of silicon in the unmasked areas essentially a diffusion process, oxidation tends to progress, though at a rapidly ever decreasing rate, also immediately underneath the masking nitride layer, even though the latter being impervious to vapor and oxygen, that is beyond the geometrical limits of the edges of the layer itself.

Therefore the thick (field) oxide obtained by the Planox method shows, in cross section, a characteristic tapering of the edges which in view of its shape it is often indicated by the name Planox's "beak".

The partial "burying" of the isolation structure, that is of the thick (field) oxide and the swaging of the edges thereof produce a morphology characterized by small and less steep steps greatly facilitating the preparation of the layer of polycrystalline silicon and of the subsequent metallization and/or isolation layers.

Nevertheless the amount of swaging, or the length of the Planox's beak, must be carefully limited because, though improving the capacitance and junction breakdown voltage or $BV_{xj}$ characteristics, it causes remarkable geometrical problems in so far as it decreases the adjacent active areas and thence imposes a limit to the reduction of the line width, problems which are strongly felt in pursuing ever increasing degrees of integration and thence of miniaturization. There is furthermore a whole series of effects well known to the expert of the field, with respect to which the structure and configuration of the field oxide layer in MOS devices should be such as to satisfy the following requirements:

(a) determining a threshold voltage of the parasitic field effect transistor formed in connection with such oxide by the interconnecting strips of polycrystalline silicon or of metal sufficiently high in order that such a parasitic transistor does not conduct when on the "gate" are applied the working voltages of the device;

(b) determining an avalanche breakdown voltage of the junction certainly higher than the maximum voltage of operation of the device;

(c) preventing "Reach-through" or $V_{PT}$ phenomena that is preventing that the depletion region of a reverse biased junction extend that much as to reach the depletion region of another uncorrelated junction which is held to ground;

(d) determining low junction capacitances along the edge of the area;

(e) determining steps as small and with as less slope as possible; and (f) requiring the minimum area as possible.

SUMMARY OF THE INVENTION

It is therefore an object of the present invention to provide a new and improved isolation structure that makes it possible to satisfy in a more easy way of the above mentioned distinct requirements. It is a further object of the present invention to provide an improved process for the preparation of MOS devices.

These and other objects and attendant advantages are obtained by the semiconductor device of the MOS type of the present invention which comprises a structure for isolating the various active and passive elements of the device obtained by the growth of silicon oxide in areas defined by masking with silicon nitride on the surface of the substrate silicon single crystal. The MOS device of the invention is characterized in that the isolation structure comprises appendices in the form of wedges of silicon oxide extending in a substantially continuous way along and from the edges of the surface portion or layer (thick or field oxide) of the isolation structure of silicon oxide inside the substrate for a depth sufficient to prevent contact and formation of a junction between a region of silicon directly underneath the top or surface portion of the isolation structure having a doping level higher than the doping level of the bulk of the substrate and the regions of silicon heavily doped with a polarity opposite to that of the substrate of the diffusions used to form the active and passive elements of the device.

Such appendices or wedges substantially perpendicular to the plane of the substrate preferably have a thickness comprised between 100 and 3000 Å even though greater thicknesses may equally be satisfactory and a depth or width preferably comprised between 0.5 and 2.5 μm. They allow separating dielectrically and completely the various doped regions of the silicon single crystal of substrate.

In particular, in N channel devices (NMOS) such wedges effectively separate dielectrically the regions of N+ type silicon, that are heavily doped with donor atoms (As, P, Sb), of the junctions from the region of P+ type silicon, that is enrichingly doped with acceptors atoms (B, In), present immediately underneath the surface layer of oxide of the isolation structure (thick or field oxide).

The separation obtained by means of such wedges allows growing the surface layer of the isolation structure (field oxide layer) much thinner in so far one is free to compensate for the consequent effect of lowering of the threshold voltage of the parasitic transistor by suitably increasing the impurity concentration, that is increasing the doping level of the silicon P+ region directly underlying the oxide layer of isolation, and thus preserving a high threshold voltage or even increasing it.

On the other hand, it is possible to increase the concentration of the P+ region under the horizontal oxide layer of the isolation structure and thus to insure a high threshold without depressing the characteristics of avalanche breakdown voltage ($BV_{xj}$) and of capacitance of the junctions because the latter are separated from the region of P+ silicon by an isolating wedge of oxide.

In particular the $BV_{xj}$ of the junctions is high because the respective depletion regions must extend in the bulk of the substrate for a long distance before coming across the high concentration of acceptor atoms present under the surface oxide layer of the isolation structure. Moreover the junctions result practically free of the effect of intensification of the electric field due to the cylindrical bending which is generated in all junctions obtained by the traditional planar and Planox processes.

Even the resistance to "Reach-through" phenomena among depletion regions of the junctions is greatly increased by the isolation structure of the invention, in fact the depletion regions must extend themselves deep in order to meet; therefore it is no longer necessary to maintain the junctions far from each other in the horizontal direction and the minimum distance between junctions is limited only by the lithographic definition of the strip along which the masking nitride is attacked.

Furthermore the possibility of drastically reducing the thickness of the surface oxide layer of the isolation structure and the shortening of the so called Planox's beak allow for improving the vertical and horizontal geometric characteristics by minimizing the height of the steps and by controlling better the configuration of the edge of the isolation structures.

In practice the minimum thickness of the surface layer of the isolation structure of silicon oxide (thick or field oxide) is dictated exclusively by the necessity to limit the capacitance towards ground of the layer of polycrystalline silicon because all other requirements of isolation among the various doped regions of the silicon single crystal of substrate are satisfied by the particular isolation structure of the invention which comprises the two vertical wedges extending themselves along the edges of the surface oxide layer towards the inside of the substrate. In this way the thickness of the surface layer of the isolation structure of silicon oxide may be reduced to only 1000-5000 Å.

The formation of the isolation structure of the invention is perfectly and easily accomplished in the cycle of treatments of the MOS processes and also the way of designing the devices does not change. Any layout already in existence may be treated with the technique of the present invention without having to modify the layout itself.

The process of the invention for the preparation of the isolation structure comprises masking of the active areas with the attack of the oxide, of the nitride and of the eventual thin layer of oxide underlying the nitride until exposing the silicon of substrate and the successive growth of the layer of silicon oxide of isolation on the exposed surfaces of the substrate for a thickness comprised preferably between 1000 and 5000 Å and it is characterized in that a window of width comprised between 50 and 1000 Å is defined along the edge of the layer of silicon oxide of isolation grown on the surface of the silicon; the silicon substrate is anisotropically attacked in correspondance of said window for a depth comprised between 0.5 and 2.5 μm; and the trench produced is filled with substantially dielectric material, preferably silicon oxide.

The way of making the necessary windows along the edge of the surface layer of oxide of isolation (field oxide layer) grown on the surface of the silicon substrate may be different. According to a first process, anisotropic attack is effected, for example by means of hot orthophosphoric acid, of the exposed lateral edge of the layer of silicon nitride covered by a layer of silicon oxide which has acted as a mask for the active areas of the surface of the single crystal during the operation of growing the surface layer of the isolation structure of silicon oxide (field oxide layer).

By controlling the duration of the attack it is possible to cause the edge of the silicon nitride layer to back in for the desired distance. Attacking then silicon oxide under isotropic conditions, the eventual thin layer of oxide on the surface of the silicon in correspondence to the window is eliminated as well as the layer of oxide covering the surface of the nitride layer. According to an alternative process, after masking the active areas by attacking the oxide, the nitride and the eventual thin layer of oxide underlying the nitride until exposing the silicon of substrate and before proceeding to grow the layer of oxide of isolation on the exposed areas of the substrate, a second layer of nitride of thickness similar to the width of the desired window is deposited, the new layer of nitride is then attacked under conditions of anisotropic attack and that allows a high rate of attack of the nitride and a low rate of attack of the silicon in order to eliminate the entire deposit with the exception of the vertical strips coating the vertical edge of the masking layer of the active areas. The surface layer of the structure of the isolation oxide is then grown on the exposed areas adjacent said vertical strips of nitride which are subsequently attacked in an isotropic manner for defining the desired windows for the anisotropic etching of silicon which will later be oxidized to form the vertical wedges of the isolation structure of the invention.

BRIEF DESCRIPTION OF THE DRAWINGS

With the aim of better illustrating the invention a practical example thereof shall be described according to the preferred embodiments and making reference to the annexed drawings wherein.

Figure 3A:
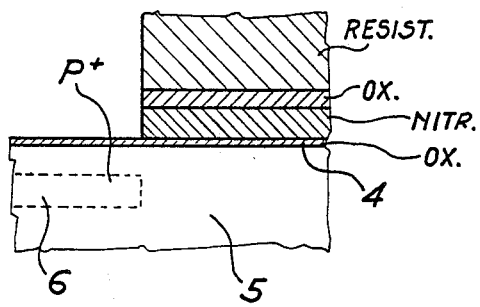
Figure 4A:
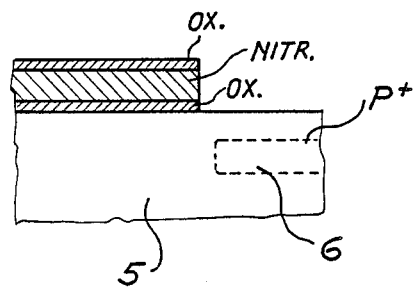

the series of FIGS. 3A, B, C, D, E show, schematically the partial microsection at 90° of the edge portion of the surface layer (field oxide) of the isolation structure of the invention at various stages of its preparation according to the first preferred process of the invention;

the series of FIGS. 4A, B, C, D, E show, schematically, the partial microsection at 90° of the edge portion of the surface layer of oxide of the isolation structure of the invention at various stages of its preparation according to another preferred process of the invention.

DESCRIPTION OF THE PREFERRED EMBODIMENTS

Solely for illustration purpose, in all figures is shown a semiconductor device of the surface field effect, N channel, MOS type formed on a P silicon chip, that is of silicon uniformly doped with acceptor atoms, for example boron atoms, up to a concentration of about $10^{15}$ atoms/cm$^3$.

Figure 1:
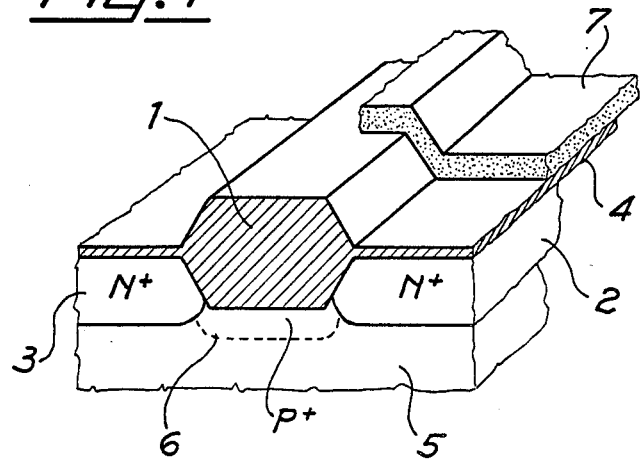
FIG. 1 is a schematic illustration in perspective of a microsection of the field oxide layer structure as obtained according to the known process.

As shown in FIG. 1, a typical microsection of the structure of the field oxide in MOS devices, as it is commonly formed according to the known technique, shows the thick oxide layer 1 disposed as to separate two N+ regions relative to two uncorrelated junctions 2 and 3, that is of two regions of the silicon substrate heavily doped with donor atoms, for example As, P or Sb, up to a concentration of about $10^{20}$ atoms/cm$^3$.

The thick (field) oxide is obtained by thermally oxidizing silicon in the areas defined by engraving by means of lithographic techniques, the masking layers of nitride and of oxide previously formed on the substrate of silicon single crystal until exposing the silicon itself. The growth of the oxide in such areas is continued until obtaining a thickness that, according to common technique, is comprised between 5000 and 15000 Å. Commonly, before proceeding to grow the thick oxide, the doping level of region 6 of the P silicon substrate directly under the field oxide layer to be formed, is increased by ion implantation until it reaches the concentration of about $10^{16}$ atoms/cm$^3$ of acceptor atoms, for example boron atoms, in order to increase the threshold voltage of the parasitic transistor which is formed when the layer of polycrystalline silicon 7 acting as the control (gate) electrode of the field effect devices, is superimposed to two uncorrelated junctions 3 and 2 separated by the thick oxide layer 1.

Figure 2:
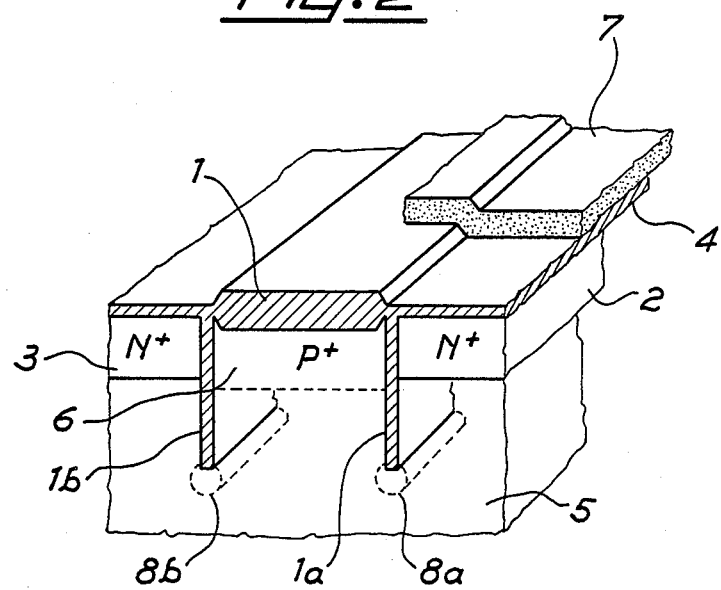
FIG. 2 is a schematic illustration in perspective of a microsection of the isolation structure made according to the present invention.

In FIG. 2 is shown the isolation structure of the present invention which is formed by a surface layer of oxide (field oxide layer) 1, obtained by oxidizing silicon in the same way as done according to the known technique, but the thickness of which may be of only 1000–5000 Å, and by two appendices or wedges 1A and 1B which extend themselves along and from the edges of the surface layer 1 (field oxide) inside the silicon substrate 5.

As it is easily observed the two appendices or wedges 1A and 1B separate dielectrically the N+ regions of the junctions 2 and 3 from the P+ region 6 underlying the thick oxide layer 1, that is the surface oxide layer of the isolation structure of the invention. Generally, in order to insure the dielectric separation among distinctly doped regions of silicon it is sufficient that the two wedges 1A and 1B extend themselves in the substrate for a depth of at least 0.5 μm and preferably for a depth comprised between 1 and 2.5 μm.

As already pointed out before, it is clear that, with the new isolation structure of the invention, the surface layer of oxide, that is the field oxide layer may be grown as thin as desired with the consequent improvement of the vertical and horizontal geometries of the device. Thinning of the field oxide layer is made possible because it is possible to increase without problems the P+ concentration of the region 6 underlying the field oxide and thus preserving a high threshold voltage without depressing the $BV_{xj}$ and capacitance characteristic of the junctions 2 and 3 because the same are separated from the P+ region by a wedge of isolating oxide.

In particular, the $BV_{xj}$ voltage of the junctions is high because the respective depletion regions extend in the substrate for a long distance before they may encounter the high boron concentration present under the thick oxide in region 6, moreover the junctions are substantially free of the intensification effect of the electric field due to the cylindrical curvature, characteristic of all junctions formed by the traditional planar and Planox processes.

Also immunity from "Reach-through" phenomena among depletion regions of uncorrelated junctions results exceptionally increased because the depletion regions relative to adjacent uncorrelated junctions must extend themselves in depth in order to be able to meet by passing under the bottom edge of the isolating wedges 1A or 1B of the isolation structure of the invention.

Desirably such an immunity from "Reach-through" may be further increased by increasing the doping level P+ of silicon in the regions 8a and 8b adjacent to the bottom edges of the wedges 1A and 1B.

In the series of FIGS. 3A, . . . 3E and 4A, . . . . 4E which show some essential stages of two preferred embodiments of the process of the invention for making the isolation structure, besides the reference numbers of the various parts or regions already utilized in FIGS. 1 and 2, are also utilized the notations OX, NITR and RESIST for indicating respectively: silicon oxide, silicon nitride and "PHOTORESIST", that is ultra-violet light sensitive resin used in the photolithographic processes employed in the fabrication of integrated circuits and semiconductor devices.

According to a first embodiment, the process of the invention for making the isolation structure comprises the following operations:

(1) thin oxidation (about 100 Å) of the surface of the silicon single crystal of substrate carried out thermally at a temperature comprised between 700° and 900° C. in a steam environment obtained by combustion of H₂ in O₂ atmosphere;

(2) deposition of the masking nitride layer (about 2000 Å), preferably by vapor phase chemical deposition (CVD) in a low pression oven at the temperature of about 800° C. from vapors of dichlorosilane (SiH₂Cl₂) and ammonia (NH₃) diluted in nitrogen;

(3) superficial oxidation of the nitride in a steam environment at the temperature of about 1000° C. for a time sufficient to the growth of a thickness of oxide of about 200 Å; or deposition of an equivalent oxide (about 500 Å) effected by chemical vapor phase deposition;

(4) masking of the active areas by common photolithographic techniques with subsequent attack of the layer of oxide and of nitride preferably effected by dry attack in plasma or by RIE (Reactive Ion Etching, that is by reactive ion bombardment) and successive implantation of a dopant of the same type as that of the substrate (boron for N channel processes). At this point the section appears as partially shown in FIG. 3A wherein it is possible to observe that the P+ doping of the region 6 of substrate 5 of P silicon has taken place and over which the thick oxide will be grown, that is the surface oxide layer of the isolation structure of the invention.

Figure 3B:
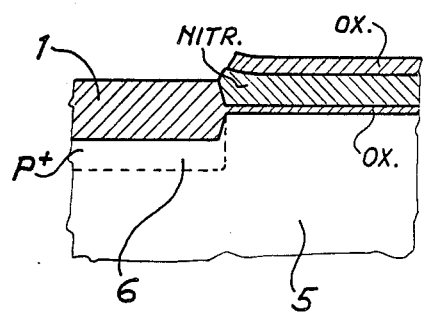

(5) Heavy field oxidation at a temperature comprised between 700° and 1000° C. in steam environment generated by combustion of H₂ in O₂ atmosphere until obtaining a thickness of oxide comprised between 1000 and 5000 Å, more preferably about 3000 Å; the section appears as shown in FIG. 3B where it is possible to observe the growth of the thick (field) oxide 1 which has taken place with an incipient wedging of the growth under the masking nitride layer (Planox's beak) very much contained because of the reduced growth which is effected.

Figure 3C:
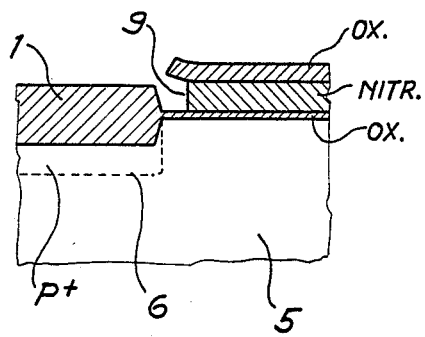

(6) Isotropic attack of the exposed edge of the masking nitride layer carried out preferably by means of orthophosphoric acid (H₃PO₄) at a temperature of about 160° C. for a period of time comprised between 10 minutes and 2 hours; the section becomes the one depicted in FIG. 3C wherein is visible the backing in 9 of the exposed edge of the nitride layer produced by the preceding attack.

(7) Attack of silicon oxide until complete removal of the layer of oxide formed over the masking nitride layer and of the thin layer of oxide of about 100 Å present under the nitride removed during the preceding attack.

Figure 3D:
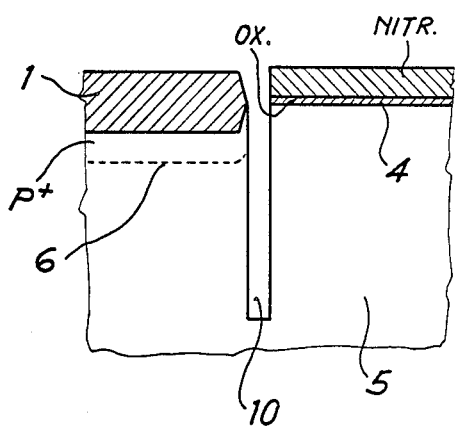

(8) Isotropic attack of silicon through the window produced through the preceding steps by reactive ion bombardment (RIE) for a depth of about 1 μm; the section is now depicted in FIG. 3D wherein is visible the trench 10 produced by the anisotropic attack of the silicon single crystal of substrate.

(9) Thermal oxidation at a temperature comprised between 700° and 1000° C. in steam environment until complete filling of the trench 10 with silicon oxide.

Figure 3E:
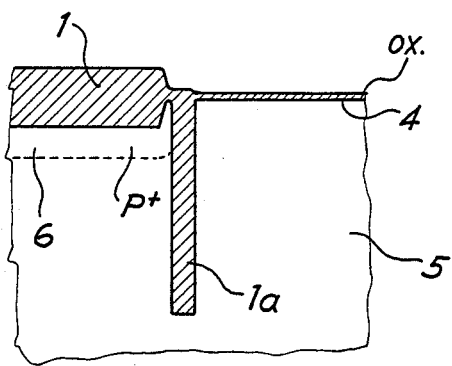

After removing the residual masking layer of silicon nitride, the isolation structure of the invention is completed so as depicted in FIG. 3E and the process for the fabrication of the MOS device proceeds according to the known technique.

According to another preferred embodiment of the process of the invention, the definition of the area where deep engraving of the silicon substrate must be effected for the formation of the isolating wedges along the edge of the surface oxide layer 1, that is the creation of the necessary windows for anisotropically attacking the substrate, may be carried out alternately by exploiting the characteristics of anisotropic attacks obtaining a greater control of the dimension of the area exposed to the attack, that is of the window, according to a process schematically depicted in the series of FIGS. 4A ... 4E.

Figure 4B:
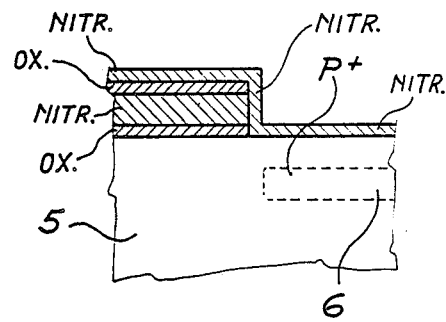
Figure 4C:
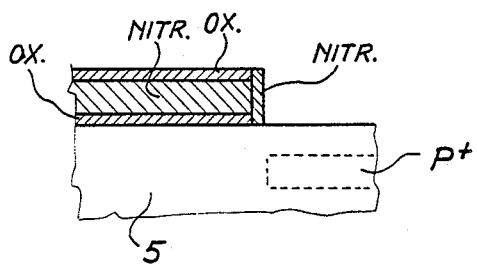

The procedure comprises the growth of a thin layer of oxide of thickness of about 100–200 Å followed by the formation, preferably by vapor phase chemical deposition, of a layer of silicon nitride of thickness comprised between 1000–2000 Å followed by the formation of a silicon oxide layer of about 200 Å of thickness on the surface of the silicon nitride layer, or by the deposition of an equivalent oxide by vapor phase chemical deposition. After these growths and formations of layers, the lithographic process is carried out with the attack of the oxide and of the nitride and of the underlying oxide until exposing the silicon (FIG. 4A). Deposition of silicon nitride for a thickness equal to the dimension of the deep etch that must desirably be obtained is carried out (FIG. 4B) and the nitride is attached anisotropically under conditions that favor a high rate of attack of the nitride and a low rate of attack of the silicon. The result is schematically shown in FIG. 4C.

Figure 4D:
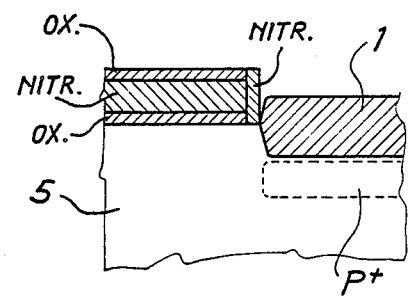
Figure 4E:
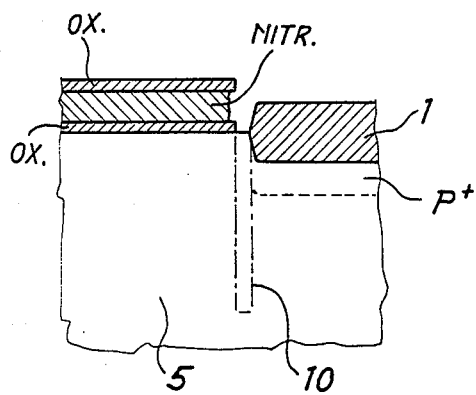

At this point a surface layer of silicon oxide of thickness of about one thousand Å may be grown (FIG. 4D), in the same way as performed in step (5) of the previously described procedure.

The subsequent attack of the nitride in an isotropic manner, then, leaves exposed a certain surface of silicon (FIG. 5) on which the anisotropic attack may be carried out for forming the trench 10 then proceeding according to the previously described procedure.

The trench 10 formed along the edge of the surface layer of oxide 1 (field oxide) of the isolation structure of the invention may even not be filled completely with silicon oxide.

In accordance with an alternative of the method of the preparation of the isolation structure of the invention, after having formed the trench 10 by anisotropic attack of silicon through the appropriate window preferably obtained according to one of the embodiments of the process of the invention described before, it is possible to proceed with an oxidation of the walls of the trench until obtaining a thin and continuous layer of silicon oxide of a thickness comprised, for example, between 100 and 200 Å. At this point the filling of the inner core of the isolating wedges may be effected with a substantially dielectrically material different from silicon oxide. For example it is possible to deposit silicon nitride or an oxide of another material until filling completely the cavity of the isolating wedges.

Though the invention has been described making reference to particularly preferred configurations and procedures, it is intended that variations and modifications may be made by the expert technician though remaining within the scope and spirit of the invention as so defined in the appended claims.

What I claim is:

1. A process of forming an isolation structure surrounding an active area on a major surface of a silicon semiconductor substrate, the isolation structure comprising at least a thick field oxide dielectric layer thermally grown over the surface of the silicon substrate at least around said active area and a trench in said substrate filled with a dielectric material along the boundary between said field oxide layer and said active area, comprising:

providing said silicon substrate having said major surface;

forming a first thin layer of silicon dioxide on said major surface;

forming a layer of silicon nitride over said first thin layer of silicon dioxide;

forming a second layer of silicon dioxide over said layer of silicon nitride;

forming a masking layer of photoresist material over said active area;

etching said second layer of silicon dioxide and said layer of nitride over unmasked areas and removing the mask material;

thermally growing a layer of silicon dioxide over said etched areas surrounding said active area covered by said nitride layer and by said second layer of silicon dioxide until forming a thick field oxide layer of silicon dioxide surrounding said covered active area;

isotropically and selectively etching an exposed lateral side of said silicon nitride layer adjacent to said thick field oxide layer and whose top surface is covered by said second silicon dioxide layer to back-in said lateral side of the silicon nitride layer for a distance comprised between 50 and 1500 angstroms;

etching said silicon dioxide second layer covering the silicon nitride layer and said silicon dioxide first layer in an area exposed by the preceding etching back of the side of said silicon nitride layer until exposing the underlying silicon semiconductor substrate;

etching the exposed silicon to form a substantially vertical trench in said substrate substantially along the edge of said thick field oxide layer surrounding said active area; and filling said trench with a dielectric material.

2. The process according to claim 1 wherein after forming said trench in the substrate and before filling said trench with a dielectric material, the doping level of the silicon substrate in a region directly underlying the bottom of said trench is increased by implantation or deposition of atoms of a dopant element.

* * * * *